(12) United States Patent
Gidon

(10) Patent No.: US 7,576,384 B2
(45) Date of Patent: Aug. 18, 2009

(54) STORAGE DEVICE WITH MULTI-LEVEL STRUCTURE

(75) Inventor: Serge Gidon, La Murette (FR)

(73) Assignee: Commissariat a l'Energie Atomique, Paris (FR)

( * ) Notice: Subject to any disclaimer, the term of this patent is extended or adjusted under 35 U.S.C. 154(b) by 62 days.

(21) Appl. No.: 12/004,882

(22) Filed: Dec. 20, 2007

(65) Prior Publication Data

US 2008/0149992 A1 Jun. 26, 2008

(30) Foreign Application Priority Data

Dec. 20, 2006 (FR) .................................. 06 55688

(51) Int. Cl.
*H01L 29/788* (2006.01)

(52) U.S. Cl. ................. 257/316; 438/257; 257/E21.18; 257/E21.423; 257/E21.681

(58) Field of Classification Search ................. 257/314, 257/315, 316, 319, 320, E21.179, E21.18, 257/E21.423, E21.681; 438/257, 258
See application file for complete search history.

(56) References Cited

U.S. PATENT DOCUMENTS

| 7,157,771 | B2 * | 1/2007 | Forbes ........................ 257/330 |
| 2005/0051806 | A1 | 3/2005 | Masuoka et al. |
| 2005/0269653 | A1 | 12/2005 | Gidon |
| 2005/0286395 | A1 | 12/2005 | Gidon et al. |
| 2006/0176353 | A1 | 8/2006 | Gidon |
| 2007/0121476 | A1 | 5/2007 | Gidon et al. |

| 2007/0274192 | A1 | 11/2007 | Gidon et al. |

FOREIGN PATENT DOCUMENTS

| EP | 0 739 004 | 10/1996 |
| EP | 1 482 555 | 12/2004 |
| EP | 1 507 294 | 2/2005 |
| WO | WO 90/11621 | 10/1990 |
| WO | WO 2004/040667 | 5/2004 |
| WO | WO 2007/135258 | 11/2007 |
| WO | WO 2007/138035 | 12/2007 |

OTHER PUBLICATIONS

French Preliminary Search Report, FA 688549, FR 0655688, dated Jul. 18, 2007.
Chhowalla, M. et al.: "Growth Process Conditions of Vertically Aligned Carbon Nanotubes Using Plasma Enhanced Chemical Vapor Deposition", J. Appl. Phys., vol. 90, No. 10, Nov. 15, 2001, pp. 5308-5317.
Chuang, V.P. et al.: "Three-Dimensional Self-Assembly of Spherical Block Copolymer Domains into V-Shaped Grooves", Nano Letters, vol. 6, No. 10, 2006, pp. 2332-2337.

(Continued)

*Primary Examiner*—Quoc D Hoang
(74) *Attorney, Agent, or Firm*—Nixon Peabody LLP

(57) ABSTRACT

Data storage device, comprising: a stack of layers formed by an alternation of first layers with a conductivity of less than approximately 0.01 $(\Omega \cdot cm)^{-1}$ and second layers with a conductivity greater than approximately 1 $(\Omega \cdot cm)^{-1}$, a plurality of columns disposed in the stack of layers, and passing through each layer in this stack. Each of the columns is formed by at least one portion of semiconductor material surrounded by least one electrical charge storage layer electrically insulated from the portion of semiconductor material and from the stack; and means of applying voltage to the terminals of the columns comprising a network of moving microspikes.

34 Claims, 4 Drawing Sheets

OTHER PUBLICATIONS

Herner, S.B. et al.: "Vertical p-i-n Polysilicon Diode with Antifuse for Stackable Field-Programmable ROM", Electron Device Letters, IEEE, vol. 25, No. 5, May 2004, pp. 271-273.

Ross, F.M. et al.: "Sawtooth Faceting in Silicon Nanowires", PRL 95, 146104, Physical Review Letters, 2005, pp. 146104-1-146104-4.

Skotnicki, T. et al.: "Transistors MOS et sa Technologies de Fabrication", Techniques de l'Ingenieur Electronique, vol. 2, No. E2430, 2000, pp. E2430-1-E2430-37.

Vettiger, P. et al.: "Millipede-Nanotechnology Entering Data Storage", IEEE Transactions on Nanotechnology, New York, vol. 1, Mar. 2002, pp. 39-55.

Vettiger, P. et al.: "The 'Millipede'—More Than One Thousand Tips for Future AFM Data Storage", IBM J. Res. Develop., vol. 44, No. 3, May 2000, pp. 323-340.

Zou, M. et al.: "Self-Assembly of Aluminum-Induced Silicon Nanowires", Electrochemical and Solid-State Letters, vol. 9, No. 4, 2006, pp. G133-G135.

* cited by examiner

STORAGE DEVICE WITH MULTI-LEVEL STRUCTURE

CROSS REFERENCE TO RELATED APPLICATIONS OR PRIORITY CLAIM

This application claims priority to French Patent Application No. 06 55688, filed Dec. 20, 2006.

TECHNICAL FIELD AND PRIOR ART

The invention concerns the field of the recording of data, and more particularly a medium for recording data on several levels.

In the computing field, larger and larger memory capacities are necessary. There exist several types of memory for recording data: mass memories, for example a hard disk or an optical disk, or dynamic memories, for example a DRAM memory ("Dynamic Random Access Memory"), or of the flash type. Dynamic memories are also called "solid memories" since no moving mechanical component is used.

Memories of the flash type are generally based on an electronic circuit produced on the surface of a silicon substrate and interconnected by electrical lines, for example copper tracks or nickel pads, placed on top of this surface. This electronic circuit may for example be produced from floating-gate MOS transistors.

In this type of MOS transistor, the floating gate is electrically insulated from the channel of the transistor by a first dielectric layer, called "tunnel oxide", and insulated electrically from the control gate of the transistor by a second dielectric layer, called an "interpoly oxide" since it comprises a stack of fine layers of oxide, nitride and oxide. The floating gate and these two dielectric layers are disposed between the control gate and the channel of the transistor. The floating gate is the information storage element. The electrical charge stored in this floating gate represents the information and causes a shift of the transfer characteristic of the transistor seen from the control gate. The reading of the information stored in the floating gate is therefore based on this shift. The write and delete operations are performed by the transfer of electrical charges through the tunnel oxide, in order to charge or discharge the floating gate. Such transistors are described in the documents WO 90-11621 and "Transistors MOS et sa technologie de fabrication" by Skotnicki, Techniques de l'Ingenieur Electronique, 2000, vol. 2, n°E2430.

To increase the capacity of a memory, it is known to increase the surface integration density of the storage elements. For example, for solid memories, progress in lithographic techniques allows a reduction in the size of the circuits, for example the transistors, thus increasing the surface integration density possible on this type of memory. However, with this type of memory, increases in the storage capacity are linked solely to the increase in the surface integration density of the storage elements.

There also exist so-called "microspike" memories comprising a storage medium addressed by means of a network of moving microspikes. These microspikes locally modify physico-chemical properties (for example mechanical, thermal or electrical) of the surface of the storage medium in order to write information thereon. This information may then be read by detecting changes to the physico-chemical properties made on the surface of the medium. In this type of memory, the ends of the microspikes define the limit of the surface density of the storage elements. The surface density obtained (for example around 0.15 Tbits/cm$^2$) predisposes these memories to large-capacity applications in a small volume, for example intended for "nomadic" devices. In addition, their manufacturing technology does not require advanced lithographic means, and their manufacturing cost remains low.

The document "The "Millipede"—More than one thousand tips for future AFM data storage)" by P. Vettiger et al., IBM J Res. Develop., vol. 44, no. 3, May 2000, pages 323 to 340, describes a microspike memory using atomic force microscopy (AFM) techniques on the surface of a storage layer based on polymer materials. The information stored in this memory is in the form of holes produced in the storage layer.

It is also possible to modify other properties of such a storage layer, such as for example conduction, modified by an electrical field generated by the microspikes.

However, here also the increases in storage capacities of such microspike memories are linked solely to the increase in the surface integration density of the storage elements and to the reduction in the dimensions of the ends of the microspikes.

DISCLOSURE OF THE INVENTION

Thus, there is a need to propose a device, the storage capacity of which is not solely linked to the surface integration density of the storage elements of the device and to the dimensions of the surface of the storage device.

For this purpose, one embodiment proposes a data storage device comprising at least:

a stack of layers formed by an alternation of first layers with a conductivity less than approximately 0.01 $(\Omega \cdot cm)^{-1}$, or less than approximately 0.1 $(\Omega \cdot cm)^{-1}$, or less than approximately $1.10^{-3}$ $(\Omega \cdot cm)^{-1}$, and second layers with a conductivity greater than approximately 1 $(\Omega \cdot cm)^{-1}$, or greater than approximately 0.1 $(\Omega \cdot cm)^{-1}$, or greater than approximately 10 $(\Omega \cdot cm)^{-1}$, a plurality of columns disposed in the stack of layers, and passing, for example perpendicularly, through each layer in this stack, each of the columns being formed by at least one portion of semiconductor material surrounded by at least one electrical charge storage layer electrically insulated from the portion of semiconductor material and from the stack.

Use is made of a storage medium consisting of "active storage columns" and comprising multiple memory levels, each second layer in the stack forming a control gate for controlling the storage areas formed by the electrical charge storage layers that surround the portions of semiconductor material of the active columns, for example over the entire thickness of the stack of layers. There is therefore a storage element at each intersection of an active column with a second layer of the stack.

Thus a three-dimensional integration of the storage circuit with a stack of the memory areas is achieved, making it possible for the increase in the storage capacity no longer to be solely linked to the increase in the surface integration density of the storage elements of the device.

It is therefore possible to obtain, with such a device, very large storage capacities at low cost, in a reduced volume, without extending the surface area of each storage layer.

In addition, with such a stack of memory levels, impairment to or faulty functioning of one of the storage levels, at one of the second layers in the stack, has no impact on the functioning of the other memory levels, the device therefore being able to continue to function.

The electrical charge storage layer of each column may be electrically insulated from the stack by a first dielectric layer surrounding said electrical charge storage layer, for example over the entire thickness of the stack of layers, and may be electrically insulated from the portion of semiconductor material by a second dielectric layer surrounding said portion of semiconductor material, for example over the entire thickness of the stack of layers.

The device may comprise means of applying voltage to the terminals of the columns that may comprise a network of moving microspikes.

Each column may comprise doping areas produced in the portion of semiconductor material, at the first layers in the stack, and forming a plurality of transistors of the floating-gate MOS type, the second layers in the stack forming the control gates and the electrical charge storage layers of the columns forming the floating gates of these transistors.

In this case, each column therefore forms a plurality of floating-gate MOS transistors connected in series.

The means of applying voltage to the terminals of the columns may comprise a multiplexing circuit.

The device may also comprise at least one electronic selector for selecting one or more columns and/or at least one electronic selector for selecting one or more second layers of the stack.

The device may also comprise electronic means for selecting one or more columns and/or means of selecting one or more second layers of the stack.

The selector of one or more columns and/or the selector of one or more second layers of the stack may be implemented by an electronic circuit produced on the substrate.

One embodiment concerns a method of producing a data storage device, comprising at least the steps of:
producing a stack of layers formed by an alternation of first layers With a conductivity of less than approximately $0.01\ (\Omega\cdot cm)^{-1}$, or less than approximately $0.1\ (\Omega\cdot cm)^{-1}$, or less than approximately $1.10^{-3}\ (\Omega\cdot cm)^{-1}$, and second layers with a conductivity greater than approximately $1\ (\Omega\cdot cm)^{-1}$, or greater than approximately $0.1\ (\Omega\cdot cm)^{-1}$, or greater than approximately $10\ (\Omega\cdot cm)^{-1}$;
etching a plurality of holes in the stack of layers, the holes passing, for example perpendicularly, through each layer in the stack;
producing columns, each being formed by at least a portion of semiconductor material surrounded by at least one electrical charge storage layer electrically insulated from the portion of semiconductor material and from the stack, in the holes.

One embodiment concerns a method of producing a data storage device, comprising at least the steps of:
producing a stack of layers formed by an alternation of first layers with a conductivity less than approximately $0.01\ (\Omega\cdot cm)^{-1}$, or less than approximately $0.1\ (\Omega\cdot cm)^{-1}$, or less than approximately $1.10^{-3}\ (\Omega\cdot cm)^{-1}$, and second layers with a conductivity greater than approximately $1\ (\Omega\cdot cm)^{-1}$, or greater than approximately $0.1\ (\Omega\cdot cm)^{-1}$, or greater than approximately $10\ (\Omega\cdot cm)^{-1}$;
producing columns, each being formed by at least one portion of semiconductor material surrounded by at least one electrical charge storage layer electrically insulated from the portion of semiconductor material;
producing means of applying voltage to the terminals of the column comprising a network of moving microspikes;
the columns being disposed in the stack of layers, passing through each layer in this stack and being electrically insulated from the stack, the electrical charge storage layer being electrically insulated from the stack.

The step of producing the stack may be implemented before the step of producing the columns, the method may also comprise, between the step of producing the stack and the step of producing columns, a step of etching a plurality of holes in the stack, the holes may pass through each layer in the stack, the columns then may be produced in the holes.

The production of the columns may be obtained by at least the steps of:
deposition of a first dielectric layer on the walls of the holes formed in the stack of layers;
deposition of the electrical charge storage layer on the first dielectric layer;
deposition of a second dielectric layer on the electric charge storage layer;
removal of the portions of dielectric layers and of the electrical charge storage layer situated at the bottom of the holes;
producing the portions of semiconductor material in the holes.

One embodiment concerns a method of producing a data storage device, comprising at least the steps of:
producing columns, each being formed by at least one portion of semiconductor material surrounded by an electric charge storage layer electrically insulated from the portion of semiconductor material;
producing a stack of layers formed by an alternation of first layers with a conductivity less than approximately $0.01\ (\Omega\cdot cm)^{-1}$, or less than approximately $0.1\ (\Omega\cdot cm)^{-1}$, or less than approximately $1.10^{-3}\ (\Omega\cdot cm)^{-1}$, and second layers with a conductivity greater than approximately $1\ (\Omega\cdot cm)^{-1}$, or greater than approximately $0.1\ (\Omega\cdot cm)^{-1}$, or greater than approximately $10\ (\Omega\cdot cm)^{-1}$, surrounding the columns, the electrical charge storage layer being electrically insulated from said stack.

The step of producing the columns may be implemented before the step of producing the stack, the layers in the stack may be produced by surrounding the columns.

The production of the columns may be obtained by at least the steps of:
producing the portions of semiconductor material;
depositing a dielectric layer, called the second dielectric layer, at least on the lateral walls of the portions of semiconductor material;
depositing the electrical charge storage layer on the second dielectric layer;
depositing another dielectric layer, called the first dielectric layer, on the electrical charge storage layer.

The production of the portions of semiconductor material may be a growth of nanowires or nanotubes of semiconductor material produced from a metal material, for example based on gold and/or nickel and/or platinum, deposited by sputtering on a substrate based on at least one semiconductor material.

The method may also comprise a step of doping areas in the portions of semiconductor material, at the first layers in the stack.

The method may also comprise, after the production of the stack and columns, a step of mechanical/chemical planing of the surface of the device and/or a step of depositing, for example by sputtering, at least partially conductive layer, for example based on carbon and metal particles, on the stack and on the tops of the columns.

The method may also comprise a step of producing means of applying voltage to the terminals of the second layers in the stack, and/or a step of producing means of applying voltage to the terminals of the columns and/or a step of producing means of measuring the current intended to flow in the columns.

The method may comprise a step of producing means of applying voltage to the terminals of the columns comprising a network of moving microspikes.

The production of the portions of semiconductor material may be a growth of silicon nanowires or carbon nanotubes produced from a metal material deposited by sputtering on a substrate based on at least one semiconductor material.

The method may also comprise a step of producing at least one selector for selecting one or more columns and/or a step of producing at least one selector for selecting one or more second layers of the stack.

Finally, the method may also comprise a step of producing means of selecting one or more columns and/or a step of producing means of selecting one or more second layers in the stack.

BRIEF DESCRIPTION OF THE DRAWINGS

The present invention will be better understood from a reading of the description of example embodiments given purely for indicative and no way limitative purposes, referring to the accompanying drawings, in which.

Identical, similar or equivalent parts in the different figures described below bear the same numerical references so as to facilitate passage from one figure to another.

The various parts shown in the figures are not necessarily shown to a uniform scale, in order to make the figures more legible.

The various possibilities (alternatives and embodiments) must be understood as not being exclusive of one another and being able to be combined with one another.

DETAILED DISCLOSURE OF PARTICULAR EMBODIMENTS

Figure 1:
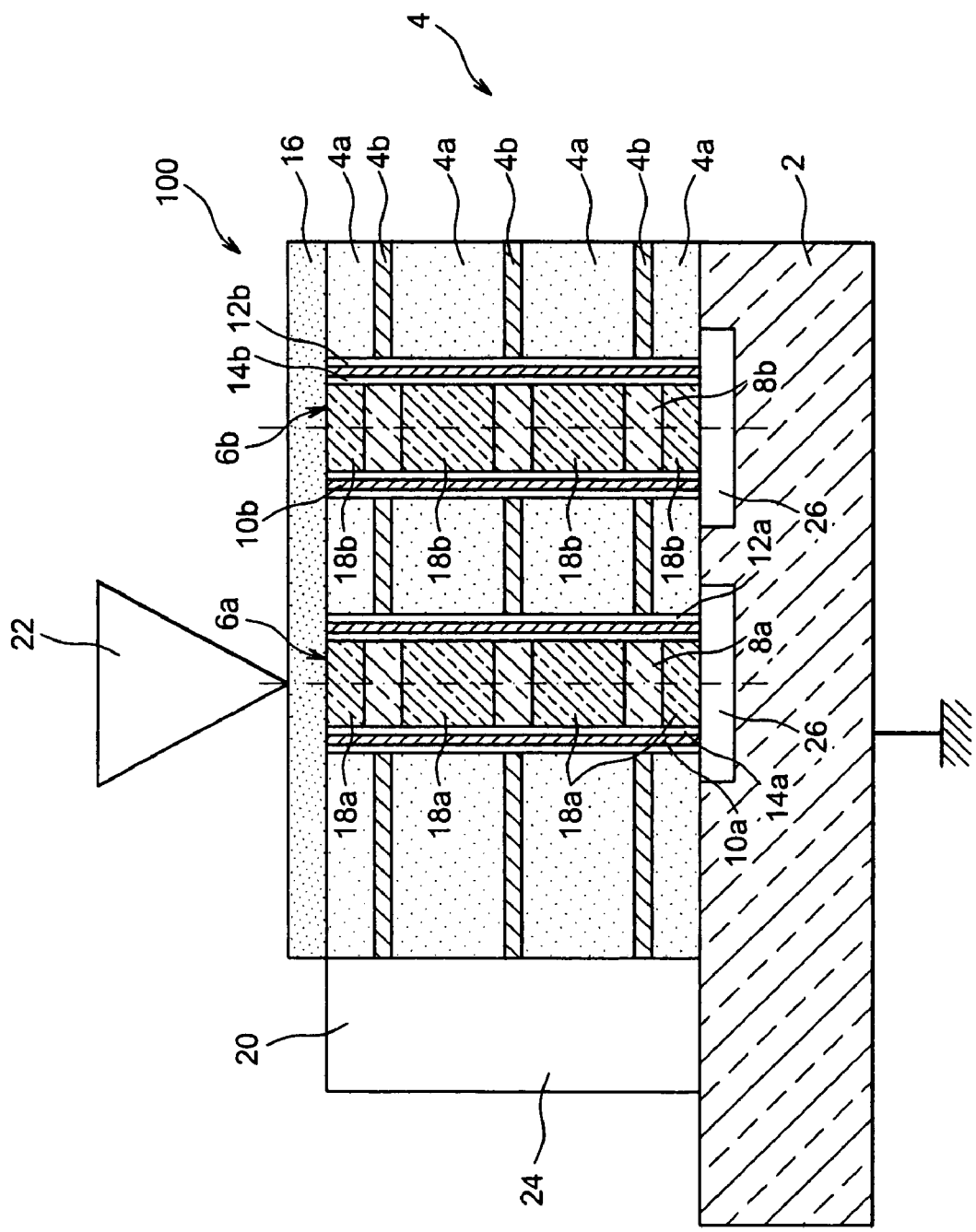
FIG. 1 is a view in section of a part of a data storage device, according to a first embodiment.

Reference is made first of all to FIG. 1, which shows a view in section of a data storage device 100 according to a first embodiment.

The device 100 comprises a substrate 2 based on at least one semiconductor material, for example silicon with crystalline orientation (111).

A stack 4, formed by an alternation of first layers 4a with a conductivity less than approximately 0.01 $(\Omega \cdot cm)^{-1}$ and second layers 4b with a conductivity greater than approximately 1 $(\Omega \cdot cm)^{-1}$, is disposed on the substrate 2.

In this first embodiment, the first layers 4a in the stack 4, four in number, are based on silicon dioxide ($SiO_2$), and/or silicon nitride (SiN), and/or any other dielectric material with low permittivity ("Low k" material), that is to say with a permittivity of less than approximately 4, such as for example silicon oxycarbide (SiOC) or hydrocarbonated silicon oxide (SiOCH).

The second layers 4b in the stack 4, here three in number, are based on polycrystalline silicon, and/or aluminum, and/or copper, and/or carbon, and/or silicon carbonitride (SiCN) and/or any other metal. In the remainder of this document, the first layers 4a in the stack 4 will be referred to as insulating layers 4a and the second layers 4b in the stack 4 will be referred to as conductive layers 4b. In this first embodiment, each conductive layer 4b is disposed between two insulating layers 4a.

In general terms, the stack 4 may be formed by at least two conductive layers 4b, each conductive layer 4b being disposed between two insulating layers 4a. For example, the insulating layers 4a may have a thickness of between approximately 10 nm and 100 nm and the conductive layers 4b may have a thickness of between approximately 3 nm and 30 nm.

The device 100 also comprises a plurality of columns passing, for example perpendicularly, through the layers 4a, 4b in the stack 4. In FIG. 1, only two columns 6a and 6b are shown. Each of the columns 6a, 6b is formed by a portion of semiconductor material 8a, 8b surrounded by an electrical charge storage layer 10a, 10b. In this first embodiment, each electrical charge storage layer 10a, 10b comprises, at the insulating layers 4a, insulating portions, and, at the conductive layers 4b, conductive portions. For reasons of simplification, these portions are not shown on the layers 10a, 10b in FIG. 1. There are thus electrical charge storage layers 10a, 10b comprising a plurality of conductive portions separated from one another by insulating portions.

Each electrical charge storage layer 10a, 10b is electrically insulated from the stack 4 and from the portions of semiconductor material 8a, 8b respectively by a first dielectric layer 12a, 12b and a second dielectric layer 14a, 14b. Each second dielectric layer 14a, 14b surrounds the entire surface of each portion of semiconductor material 8a, 8b situated at the stack 4, that is to say over the entire thickness of the stack 4. Each second dielectric layer 14a, 14b is surrounded by an electrical charge storage layer 10a, 10b, itself surrounded by a first dielectric layer 12a, 12b.

In this first embodiment, the portions of semiconductor material 8a, 8b are based on silicon, for example silicon nanowires. The portions 8a, 8b may also be based on carbon nanotubes. The insulating portions of the electrical charge storage layers 10a, 10b are for example based on silicon oxide, and/or SiN and/or aluminum oxide ($Al_2O_3$). The conductive portions of the electrical charge storage layers 10a, 10b are here based on polycrystalline silicon and/or silicon-germanium (SiGe) and/or any other electrically conductive material.

In an alternative embodiment, the electrical charge storage layers may not include conductive portions and insulating portions but be based on silicon oxide of the $SiO_x$ type with x<2 and/or silicon nitride, containing silicon, and/or any other dielectric material with a permittivity greater than approximately 4 ("High k") such as silicon oxynitride (SiON) and/or $HfSiO_x$ (with $1 \leq x \leq 3$) and/or tantalum oxide ($Ta_2O_5$) comprising nanoparticles of silicon or any other metal material.

The second dielectric layers 14a, 14b separating the electrical charge storage layers 10a, 10b and the portions of semiconductor material 8a, 8b are for example based on at least one dielectric material, such as silicon oxide and/or SiN and/or any other "High k" material. Finally, in this first embodiment, the first dielectric layers 12a, 12b separating the electrical charge storage layers 10a, 10b and the stack 4 are formed by a sub-layer based on semiconductor nitride, such as SiN, disposed between two sub-layers based on semiconductor oxide, for example silicon oxide, and/or any other "High k" material.

In the example in FIG. 1, the columns 6a, 6b are regularly spaced apart from one another by a distance of between approximately 22 nm and 66 nm in the case of production by conventional lithography means, or even by a distance of less than approximately 22 nm in the case of production by a so-called "self-organization" method or by ascending method. In this embodiment, the columns 6a, 6b have a substantially cylindrical shape and have dimensions substantially similar to one another. The portions of semiconductor material 8a, 8b have for example a circular cross section with a diameter equal to approximately 20 nm. The dielectric layers 12a, 12b and 14a, 14b have for example a thickness of between approximately 1 nm and 10 nm. Finally, the electrical charge storage layers 10a, 10b have for example a thickness of between approximately 1 nm and 10 nm. In another embodiment, these columns 6a, 6b might have a cross section with a different shape, for example rectangular, and not have similar dimensions, nor be spaced apart evenly from one another (in particular in the case of production by a self-organization method).

The device 100 in FIG. 1 also comprises an at least partially conductive layer 16, for example based on carbon made slightly conductive by metal particles, disposed on the stack 4 and on the tops of the columns 6a, 6b. The layer 16 may also be based on silicon carbide (SiC) and/or thin layers of amorphous carbon (DLC, standing for "diamond-like carbon"). This layer 16 has a thickness of between approximately 2 nm and 20 nm, so that its conductivity allows a current to pass, at one of the columns 6a, 6b, between the face of the layer 16 that is not in contact with the stack 4 and said column, without short-circuiting the other columns. The conductivity of the layer 16 is, for example, between approximately 0.1 $(\Omega \cdot cm)^{-1}$ and 100 $(\Omega \cdot cm)^{-1}$. In an alternative, the layer 16 may also be an insulating layer, for example based on alumina, the thickness of which, for example equal to approximately 1 nm, is chosen so as to obtain a tunnel effect between this layer 16 and the columns 6a, 6b. Finally, the layer 16 may also be based on a conductive organic material such as polyaniline (PANI).

In this first embodiment, each column 6a, 6b comprises doping areas 18a, 18b produced in the portion of semiconductor material 8a, 8b at the insulating layers 4a in the stack 4. The columns 6a, 6b thus form a set of transistors of the floating-gate MOS type. In FIG. 1, each column 6a, 6b forms three floating-gate MOS transistors. The doping areas 18a, 18b form source and drain areas for the transistors. The transistors of each column 6a, 6b are therefore connected in series by these source and drain areas. The conductive layers 4b form the control gates, and the electrical charge storage layers 10a, 10b form the floating gates of these transistors. The non-doped areas of the portions of semiconductor material 8a, 8b are the channel areas of these transistors.

Finally, the device 100 comprises an electronic circuit 20 disposed on the substrate 2. This electronic circuit 20 comprises means of applying voltage 24 to the terminals of the conductive layers 4b of the stack 4. A network of moving microspikes 22 (a single moving microspike 22 is shown in FIG. 1) makes it possible to apply a voltage to the terminals of the columns 6a, 6b, by means of the layer 16. In addition, means 26 of measuring the current flowing in the columns 6a, 6b are integrated in the substrate 2. These current measurement means 26 may be specific to each microspike or common to all the columns 6a, 6b addressed by one of the microspikes. The current measurement relating to a microspike may be made for example with a current to voltage converter amplifier, and a threshold comparator, making it possible to discriminate a logic level relating to the measured current. The electronic circuit 20 also comprises means of selecting one or more columns 6a, 6b, or selector for selecting one or more columns 6a, 6b, and means of selecting, or selector of, one or more conductive layers 4b in the stack 4. These selection means or selectors are here an integrated circuit implemented in CMOS technology that selects one or more levels, that is to say one or more conductive layers 4b, by fixing the potential or potentials applied to the layer or layers 4b selected, for example a "cold" potential such as ground, a "hot" potential such as a voltage higher in absolute value than ground, close to the potential applied by the microspike at the terminals of the column or columns selected, being applied to the other conductive layers 4b not selected. Means of multiplexing the addresses (of the microspikes selected and/or conductive layers 4b selected) may also be integrated in the electronic circuit 20.

The floating gate formed by the electrical charge storage layers 10a, 10b of each transistor is the unit information storage element of the device 100, that is to say it represents a storage bit. This storage element may also store several bits by multiplying the number of detection threshold levels possible, provided that the noise sensitivity so permits. Information is therefore written, read or deleted at the crossing of one of the columns 6a, 6b and a conductive layer 4b, by modifying or detecting the electrical charge present at this crossing in the electrical charge storage layer surrounding said column. Thus the electrical charge storage places in one of the columns 6a, 6b are defined by the presence of the control gates formed by the conductive layers 4b and by the channel areas of the transistors.

An operation of writing a bit in the device 100 of FIG. 1 will now be described.

The column 6a in which the information bit must for example be stored is selected by the column selection of the electronic circuit 20 by positioning the microspike 22 above the column 6a, in contact with the layer 16. The microspike 22 applies a voltage, for example equal to approximately −5 V, to the terminals of the semiconductor portion 8a. Given that the microspike 22 has a negative potential with respect to the semiconductor material 8a, the doped areas 18a of each transistor of the column 6a situated on the same side as the microspike 22 with respect to the non-doped areas of the semiconductor 8a forming the channel areas of these transistors are the source areas of these transistors.

One of the conductive layers 4b is then selected by the conductive layer selector of the electronic circuit 20 by applying a positive voltage, for example equal to approximately +5 V, to the terminals of the conductive layer 4b, thus choosing the transistor in which the information bit will be stored. A strong electrical field is created at the second dielectric layer 14a, enabling the electrons situated in the channel of the transistor to pass the potential barrier formed by the second dielectric layer 14a by tunnel current ("Fowler-Nordheim" effect), and thus to store a certain electrical charge in the electrical charge storage layer 10a, at the conductive layer 4b.

The charge stored in this floating gate causes a shift in the characteristic I(V) of the transistor seen from the control gate, formed by the conductive layer 4b. Access in read mode to this transistor in which the information bit has been stored is effected by biasing the control gates of the other transistors of the column 6a, that is to say by applying voltage, for example of between approximately 2.2 V and 3.3 V, according to the technology used, to the terminals of the conductive layers 4b other than the one forming the control gate of the transistor comprising the information to be read, so as to make the other transistors of the column 6a conductive, whatever their initial state. A voltage, for example equal to approximately 0 V, is also applied to the control gate of the transistor comprising the information to be read. By detecting the level of the current flowing in the conductive transistor, it is possible to determine the information contained in the floating gate of the transistor. For example, this information is determined by comparing this current level to a threshold of a comparator, or to several thresholds of this comparator in the case where the information comprises several bits.

The access time in read mode and write mode of the storage device may be optimized by grouping together the information words of, for example, 8, 16 or 32 bits, each word being written on a column. The number of storage levels of the columns, that is to say the number of storage layers that the storage device has, may therefore be adapted according to the size of the information words written or read.

Deletion is the process enabling the floating gate of the transistor to be discharged of the electrons that are stored thereon. For this, a negative voltage, for example equal to −5 V, is applied to the control gate of the transistor in which the information is stored in order to create an electrical field at the second dielectric layer separating the portion of semiconductor material from the electrical charge storage layer. This electrical field enables the electrons stored in the floating gate to pass through the second dielectric layer by "Fowler-Nordheim" effect and therefore to erase the information contained in the floating gate.

This erasure may also be obtained by applying a positive voltage, for example equal to approximately +5 V, to the source potential of the transistor and a zero gate voltage to the transistor. Thus the electrons stored are discharged in the source by tunnel current ("Fowler-Nordheim" effect). The potential of the drain of the transistor is left floating in order to limit the drain-source leakage current. Finally, this erasure may also be effected by applying both a negative voltage to the gate of the transistor and a positive voltage to the source. In this way the content stored partly by the channel and partly by the source is erased.

Figure 2:
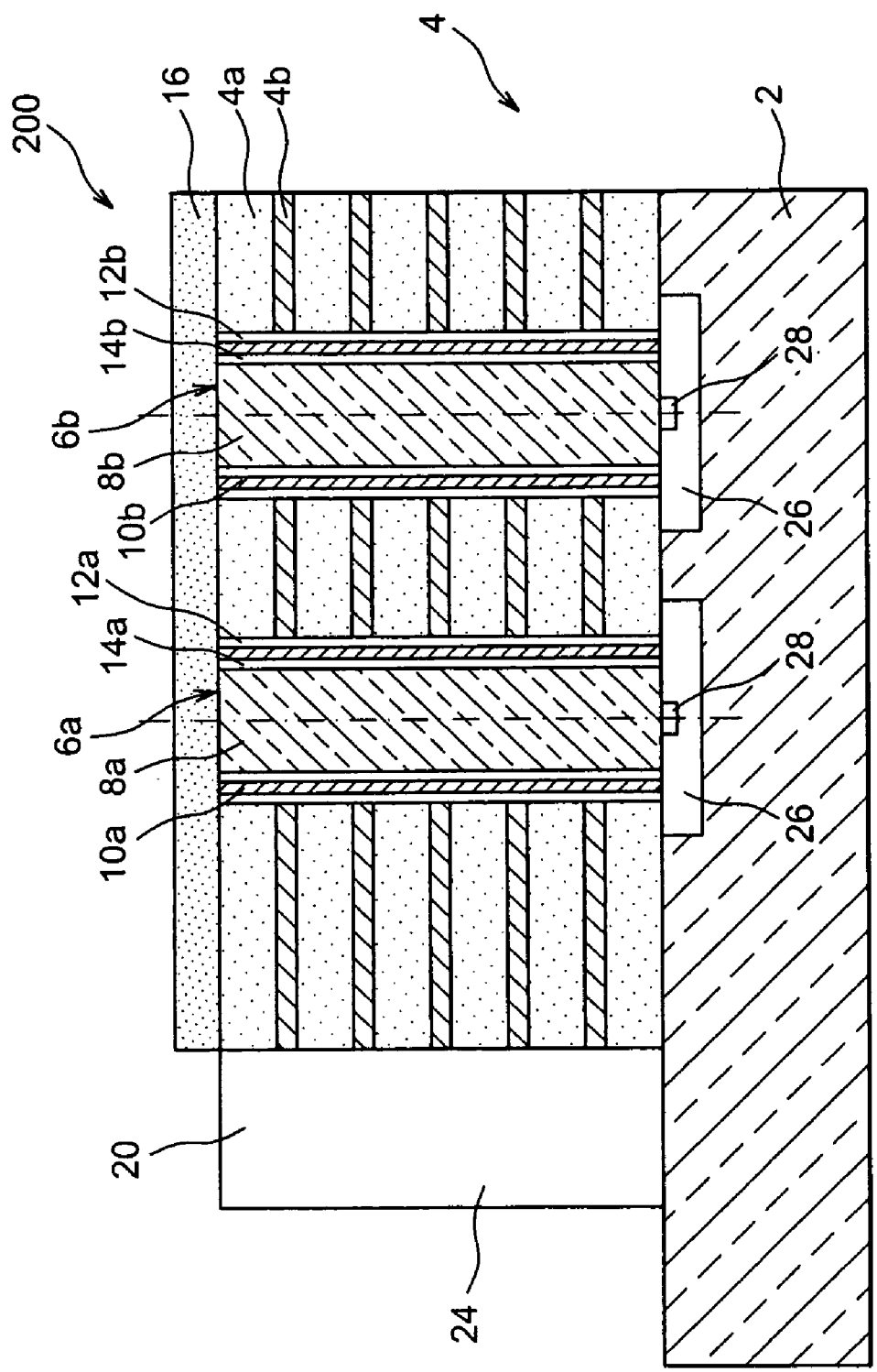
FIG. 2 is a view in section of a part of a data storage device, according to a second embodiment.

FIG. 2 depicts a data storage device 200 according to a second embodiment.

Compared with the device 100 in FIG. 1, the stack 4 of the device 200 comprises two conductive layers 4b and two insulating layers 4a in addition. However, it is possible to produce a stack 4 comprising a greater or lesser number of conductive layers 4b and insulating layers 4a than the number of these layers in FIGS. 1 or 2.

In this second embodiment, the portions of semiconductor material 8a, 8b are based on carbon nanotubes. In an alternative, the portions of semiconductor material 8a, 8b might be based on silicon nanowires, each nanowire being doped homogeneously over the whole of its structure. The portions 8a, 8b do not comprise, in this embodiment, doping areas forming transistor source and drain areas. The conductive layers 4b therefore serve here both as control gates for modifying the charge present in the electrical charge storage layers 10a, 10b, but also to establish the density of carriers in certain areas of the portions of semiconductor material 8a, 8b of the columns 6a, 6b, these areas having a similar behaviour to MOS transistor drain and source areas, to allow the formation of transistors in the columns 6a, 6b. This is because, by applying a voltage to one of the conductive layers 4b, an accumulation of free charges is established in the area of the column 6a, 6b situated facing said conductive layer 4b, these charges may migrate in this area, which then forms a channel area of a transistor biased or charged on its gate.

Compared with the device according to the first embodiment, given that it is not necessary to have pre-defined doping areas in the portions of semiconductor material of the columns, it is possible to control, by electrostatic field, the presence of carriers in the areas of the columns 6a, 6b situated facing the conductive layers 4b and therefore to produce a storage device 200 comprising conductive layers 4b and insulating those 4a that are finer than those of the storage device 100.

Figure 3:
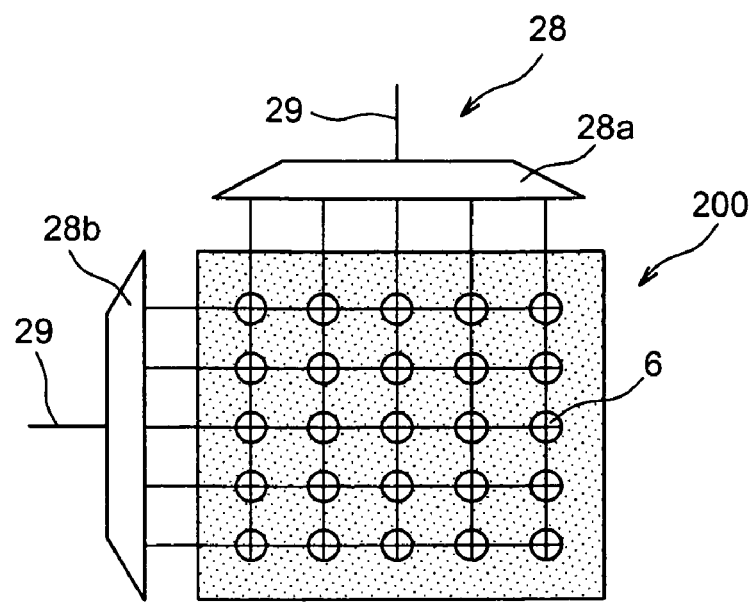
FIG. 3 is a view from below of a part of a data storage device, according to the second embodiment.

Finally, compared with the first embodiment, it is not microspikes that apply a voltage to the terminals of the columns 6a, 6b, but a multiplexing circuit 28. However, it is also possible that a network of moving microspikes apply a voltage to the terminals of the columns 6a, 6b, as in the first embodiment described previously. FIG. 3 shows a partial view from below of the device 200. In this FIG. 3, only twenty-five columns 6 are shown, disposed in five rows of five columns. The columns 6 are connected by the multiplexing circuit 28, comprising two multiplexers 28a, 28b, and connection wires connecting each column 6 to the two multiplexers 28a, 28b. It is thus possible to address a voltage applied at the input by wires 29 on one or more columns 6. It is also possible that the voltages applied to the terminals of the columns 6 of this storage device 200 are applied by microspikes.

This second embodiment is particularly advantageous when the stack 4 comprises at least eight conductive layers 4b and the centres of the cross sections of the columns 6 are spaced apart by a distance of less than approximately 100 nm.

In an alternative of the first and second embodiments, it is possible for the conductive layers 4b to be produced, in an alternating fashion, with materials with different electron affinities, for example pairs of two materials chosen from polycrystalline silicon, aluminum, copper, carbon and SiCN. Thus it is possible to control the gate potentials, the material chosen, characterised by its electron affinity, fixing the gate potential in order to perform an operation of reading, writing or deleting information in the columns situated at these conductive layers 4b.

A method of producing the storage device 100 will now be described in relation to FIGS. 4A to 4F.

Figure 4A:
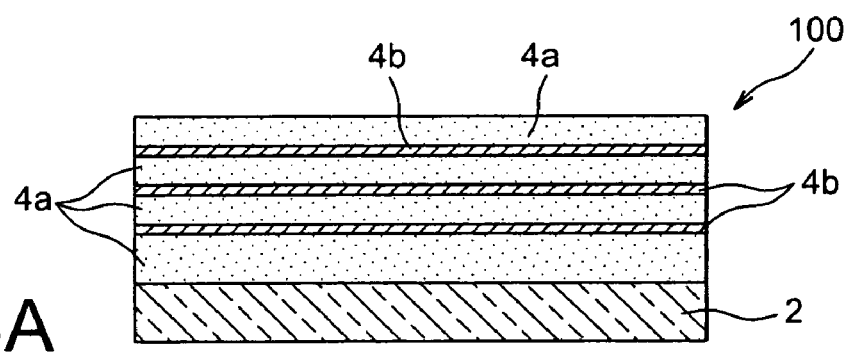
FIGS. 4A to 4F depict steps of a method of producing a data storage device, according to the first embodiment.

As shown in FIG. 4A, the stack 4 is first of all produced by the alternating depositions, for example PVD ("Physical Vapour Deposition"), of insulating layers 4a and conductive layers 4b on the substrate 2. All the functioning and control elements of the device 100, that is to say the electronic circuit 20 and the current measurement means 26, not shown in FIGS. 4A to 4F, may be produced on the substrate 2 before the production of the stack 4 ("above IC") integration.

Next the stack 4 is structured by a lithogravure step. An etching mask 30, for example based on photosensitive resin or a layer of material deformed by moulding, is deposited on the stack 4. The layer of material deformed by moulding may be obtained from a layer of plastic material deposited, for example by deposition using a spinner, on the surface of the stack 4. A mould is deposited on this plastic layer, and then a pressure applied to the mould impresses the patterns of the mould on this plastic layer, then forming the etching mask 30. This etching mask 30 may advantageously be produced by a deposition of nanoparticles or a mixture of non-miscible constituents based on diblock polymers, as described in the document "Three-Dimensional Self-Assembly of Spherical Block Copolymer Domains into V-Shaped Grooves" by V. P. Chuang et al., 2006, Nano Letters Vol. 6, no. 10, pages 2332 to 2337.

Figure 4B:
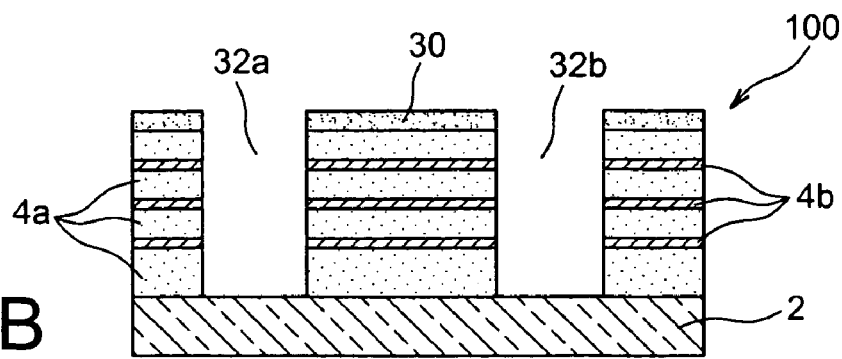

The mask 30 makes it possible to transfer the pattern defining the locations of the columns in the stack 4 by an etching method such as ion etching or reactive ion etching (RIE). In this way a plurality of holes 32a, 32b are obtained in the stack 4, the holes 32a, 32b passing through the stack 4 as far as the substrate 2. In FIG. 4B, only two holes 32a, 32b are shown.

Figure 4C:
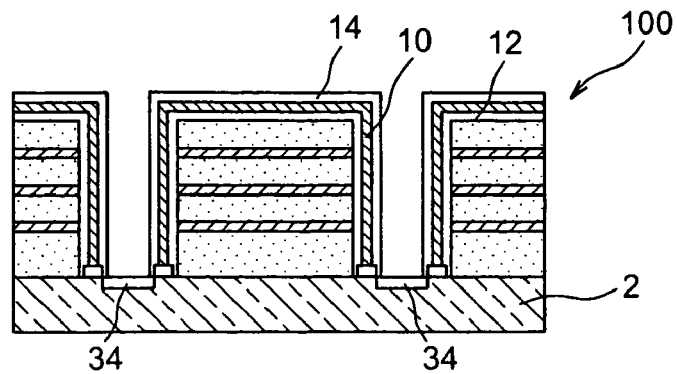
Figure 4D:
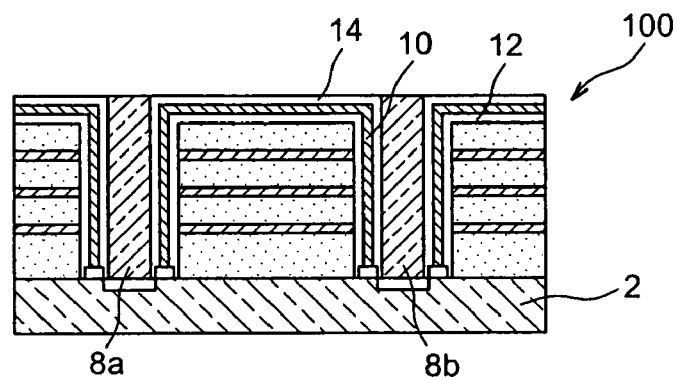

Next there is deposited, for example by CVD deposition ("Chemical vapour Deposition"), a first dielectric layer 12 on the stack 4 and on the walls inside the holes 32a, 32b. An electrical charge storage layer 10 is then deposited by CVD on the first dielectric layer 12. Finally, the storage layer 10 is covered by a second dielectric layer 14 deposited by CVD (FIG. 4C). Portions of the dielectric layers 12, 14 and of the electrical charge storage layer 10 situated at the bottom of the holes 32 may be removed, for example by dry etching. A catalyst 34, for example based on a metal such as aluminum, nickel or gold, is deposited at the bottom of the holes 32a, 32b, in order to achieve a growth of silicon nanowires forming the portions of semiconductor material 8a, 8b in the holes 32a, 32b, forming the columns of the storage device 100 (FIG. 4D).

Figure 4E:
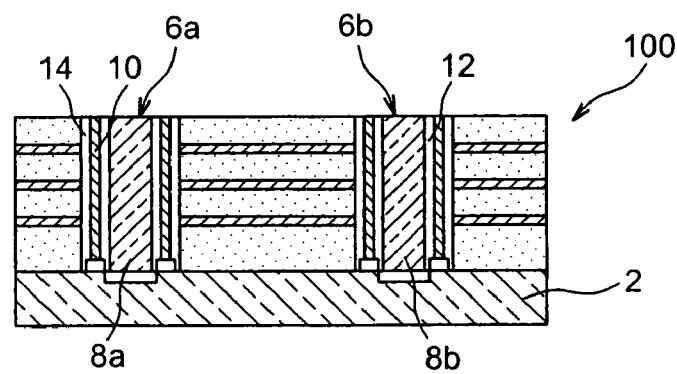

A mechanical/chemical planing of the top surface of the device 100 is then carried out, thus removing the portions of the dielectric layers 12, 14 and of the electric charge storage layer 10 not situated in the holes 32 and the etching mask 30, as shown in FIG. 4E.

Figure 4F:
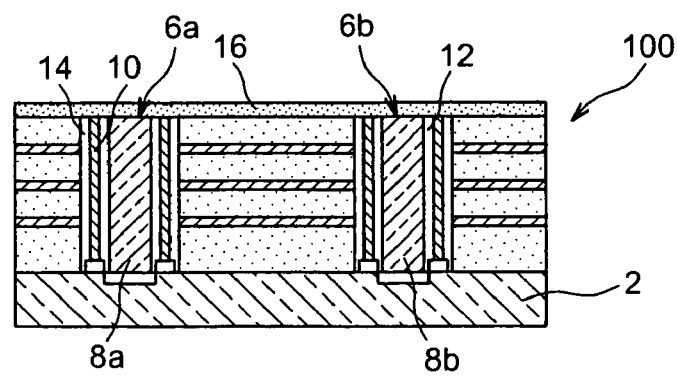

Finally, as shown in FIG. 4F, the at least partially conductive layer 16 is deposited on the whole of the device 100, for example by sputtering carbon and metal particles, this layer 16 reducing the wear on the microspikes 22 when these come into contact in order to apply a voltage to the columns.

According to an alternative of this production method, it is possible first of all to effect the growth of silicon nanowires, or carbon nanotubes, on the substrate 2, forming the portions of semiconductor material 8a, 8b and then to cover them with the second dielectric layer 14, the electrical charge storage layer 10 and the first dielectric layer 12, for example by CVD deposition and/or oxidation of a semiconductor such as silicon, forming the columns of the storage device. When the substrate 2 is based on silicon of crystalline orientation (111), the nanowires obtained by growth are oriented substantially perpendicularly with respect to the face of the substrate 2 on which the growth is carried out. When the substrate 2 is based on silicon of crystalline orientation (100), the nanowires obtained by growth are no longer oriented substantially perpendicular to said face of the substrate 2, which subsequently makes it possible to obtain for example transistors in the columns comprising channel areas longer than those of the transistors produced in columns disposed perpendicularly with respect to said face of the substrate 2. Next the stack 4 is produced around the columns by successive and alternating depositions of insulating 4a and conductive 4b layers, for example by PVD deposition ("Physical Vapour Deposition").

The invention claimed is:

1. Data storage device comprising at least:
   a stack of layers formed by an alternation of first layers with a conductivity of less than approximately 0.01 $(\Omega \cdot cm)^{-1}$ and second layers with a conductivity greater than approximately 1 $(\Omega \cdot cm)^{-1}$,
   a plurality of columns disposed in the stack of layers, and passing through each layer in this stack, each of the columns being formed by at least one portion of semiconductor material surrounded by least one electrical charge storage layer electrically insulated from the portion of semiconductor material and from the stack,
   means of applying voltage to the terminals of the columns comprising a network of moving microspikes.

2. Device according to claim 1, the columns passing perpendicularly through the layers of the stack.

3. Device according to claim 1, the first layers in the stack being based on silicon oxide and/or silicon nitride and/or any other dielectric material with a permittivity of less than approximately 4.

4. Device according to claim 1, the second layers in the stack being based on polycrystalline silicon and/or metal and/or carbon and/or silicon carbonitride.

5. Device according to claim 1, the materials forming the second layers of the stack being, in alternation, materials with different electron affinities.

6. Device according to claim 1, the portions of semiconductor material comprising silicon nanowires.

7. Device according to claim 1, the portions of semiconductor material comprising carbon nanotubes.

8. Device according to claim 1, the electrical charge storage layer comprising, at the second layers of the stack, conductive portions separated from one another by insulating portions.

9. Device according to claim 8, the insulating portions of the electrical charge storage layer being based on silicon oxide and/or aluminium oxide and/or silicon nitride.

10. Device according to claim 8, the conductive portions of the electrical charge storage layer being based on polycrystalline silicon and/or silicon-germanium and/or any other electrically conductive material.

11. Device according to claim 1, the electrical charge storage layers being based on silicon oxide of the $SiO_x$ type with x<2 and/or silicon nitride, containing silicon, and/or any other dielectric material with a permittivity greater than approximately 4 comprising nanoparticles of silicon or any other metal material.

12. Device according to claim 1, also comprising a substrate based on at least one semiconductor material, on which the stack is disposed.

13. Device according to claim 12, the substrate being based on silicon of crystalline orientation (111).

14. Device according to claim 1, the electrical charge storage layer of each column being electrically insulated from the stack by a first dielectric layer surrounding said electrical charge storage layer, and being electrically insulated from the portion of semiconductor material by a second dielectric layer surrounding said portion of semiconductor material.

15. Device according to claim 14, the second dielectric layer being based on semiconductor oxide such as silicon oxide, and/or silicon nitride and/or any other dielectric material with a permittivity greater than approximately 4.

16. Device according to claim 14, the first dielectric layer comprising at least one sub-layer based on semiconductor nitride disposed between two sub-layers based on semiconductor oxide and/or any other dielectric material with a permittivity greater than approximately 4.

17. Device according to claim 1, the columns having a substantially cylindrical shape.

18. Device according to claim 1, the columns being regularly spaced apart from one another and/or having substantially similar dimensions.

19. Device according to claim 1, also comprising at least one partially conductive layer disposed on the stack of layers and on the tops of the columns.

20. Device according to claim 19, the at least partially conductive layer being based on carbon and metal particles.

21. Device according to claim 1, also comprising:
   means of applying voltage to the terminals of the second layers of the stack,
   means of measuring the current intended to flow in the columns.

22. Device according to claim 21, also comprising at least one electronic selector for selecting one or more columns and/or at least one electronic selector for selecting one or more second layers of the stack.

23. Device according to claim 22, the selector of one or more columns and/or the selector of one or more second layers of the stack being implemented by an electronic circuit produced on the substrate.

24. Device according to claim 1, each column comprising doping areas produced in the portion of semiconductor material, at the first layers of the stack, and forming a plurality of transistors of the floating-gate MOS type, the second layers of the stack forming the control gates and the electrical charge storage layers of the columns forming the floating gates of these transistors.

25. Method of producing a data storage device, comprising at least the steps of:
  producing a stack of layers formed by an alternation of first layers with a conductivity less than approximately 0.01 $(\Omega\cdot cm)^{-1}$ and second layers with a conductivity greater than approximately 1 $(\Omega\cdot cm)^{-1}$;
  producing columns, each being formed by at least one portion of semiconductor material surrounded by at least one electrical charge storage layer electrically insulated from the portion of semiconductor material;
  producing means of applying voltage to the terminals of the columns comprising a network of moving microspikes;
  the columns being disposed in the stack of layers, passing through each layer in this stack and being electrically insulated from the stack, the electrical charge storage layer being electrically insulated from the stack.

26. Method according to claim 25, the step of producing the stack being implemented before the step of producing the columns, the method also comprising, between the step of producing the stack and the step of producing columns, a step of etching a plurality of holes in the stack, the holes passing through each layer in the stack, the columns then being produced in the holes.

27. Method according to claim 26, the production of the columns being obtained by at least the steps of:
  depositing a first dielectric layer on the walls of the holes formed in the stack of layers;
  depositing the electrical charge storage layer on the first dielectric layer;
  depositing a second dielectric layer on the electrical charge storage layer;
  removing the portions of dielectric layers and of the electrical charge storage layer situated at the bottom of the holes;
  producing portions of semiconductor material in the holes.

28. Method according to claim 25, the step of producing the columns being implemented before the step of producing the stack, the layers of the stack being produced by surrounding the columns.

29. Method according to claim 28, the production of the columns being obtained by at least the steps of:
  producing portions of semiconductor material;
  depositing a dielectric layer, called the second dielectric layer, at least on the lateral walls of the portions of semiconductor material;
  depositing the electrical charge storage layer on the second dielectric layer;
  depositing another dielectric layer, called the first dielectric layer, on the electrical charge storage layer.

30. Method according to claim 27, the production of the portions of semiconductor material being a growth of silicon nanowires or carbon nanotubes produced from a metal material deposited by sputtering on a substrate based on at least one semiconductor material.

31. Method according to claim 25, also comprising a step of doping areas in the portions of semiconductor material, at the first layers of the stack.

32. Method according to claim 25, also comprising, after the production of the stack and columns, a step of depositing an at least partially conductive layer on the stack and on the tops of the columns.

33. Method according to claim 25, also comprising a step of producing means of applying voltage to the terminals of the second layers of the stack and/or a step of producing means of measuring the current intended to flow in the columns.

34. Method according to claim 25, also comprising a step of producing at least one selector for selecting one or more columns and/or a step of producing at least one selector for selecting one or more second layers of the stack.

* * * * *